United States Patent
Nasuno et al.

(10) Patent No.: US 12,283,670 B2
(45) Date of Patent: Apr. 22, 2025

(54) POWER STORAGE CONTROL SYSTEM AND POWER STORAGE CONTROL METHOD

(71) Applicant: KANEKA CORPORATION, Osaka (JP)

(72) Inventors: Yoshiyuki Nasuno, Osaka (JP); Haruya Mori, Osaka (JP)

(73) Assignee: KANEKA CORPORATION, Osaka (JP)

( * ) Notice: Subject to any disclaimer, the term of this patent is extended or adjusted under 35 U.S.C. 154(b) by 703 days.

(21) Appl. No.: 17/481,752

(22) Filed: Sep. 22, 2021

(65) Prior Publication Data
US 2022/0006133 A1 Jan. 6, 2022

Related U.S. Application Data (63) Continuation of application No. PCT/JP2020/008133, filed on Feb. 27, 2020.

(30) Foreign Application Priority Data

Mar. 22, 2019 (JP) .................................. 2019-054984

(51) Int. Cl.
*H01M 10/48* (2006.01)
*G01R 31/36* (2020.01)
(Continued)

(52) U.S. Cl.
CPC .......... *H01M 10/486* (2013.01); *G01R 31/36* (2013.01); *G01R 31/387* (2019.01); *H01M 10/48* (2013.01);
(Continued)

(58) Field of Classification Search
CPC ............... G01R 31/387; G01R 31/392; H01M 10/48; H01M 10/441; H01M 2010/4271;
(Continued)

(56) References Cited

U.S. PATENT DOCUMENTS 6,664,000 B1 12/2003 Sonobe
11,515,561 B2 * 11/2022 Koyamada ............ H02J 7/0069
(Continued)

FOREIGN PATENT DOCUMENTS

JP 2001-102092 A 4/2001
JP 2013051839 A * 3/2013 ................ H02J 7/00
(Continued)

OTHER PUBLICATIONS

English translation of Notice of Reasons for Refusal for Japanese Patent Application No. 2021-508857 dated Mar. 19, 2024 (Year: 2023).*
International Search Report issued in PCT/JP2020/008133; mailed Apr. 7, 2020.

*Primary Examiner* — Mi'Schita' Henson
(74) *Attorney, Agent, or Firm* — Studebaker Brackett PLLC (57) ABSTRACT

A power storage control system reduces the operating cost in a power storage system, and comprises a monitoring section and a charge/discharge control section. The monitoring section monitors a prescribed index value that correlates with the degradation degree of a storage battery for each storage battery included in a plurality of power storage systems. The charge/discharge control section controls the period in which the prescribed index value of each storage battery changes to a prescribed value by degradation accompanying charging and discharging of the storage battery, by performing control relating to at least one of the charge amount or the charge/discharge speed in charging and discharging of the storage battery based on the monitoring results of the monitoring section.

20 Claims, 4 Drawing Sheets

(51) Int. Cl.
  *G01R 31/387* (2019.01)
  *H02J 7/00* (2006.01)
  *G01R 31/392* (2019.01)
(52) U.S. Cl.
  CPC ............ *H02J 7/0048* (2020.01); *H02J 7/005* (2020.01); *G01R 31/392* (2019.01)
(58) Field of Classification Search
  CPC ........ H02J 7/0048; H02J 7/005; H02J 7/0013; H02J 13/00002
  See application file for complete search history.

(56) References Cited

U.S. PATENT DOCUMENTS

2002/0030494 A1* 3/2002 Araki .................... G01R 31/392
                                                              324/427
2020/0009990 A1* 1/2020 Shiiyama ................ B60L 53/30

FOREIGN PATENT DOCUMENTS

| JP | 2014-055896 | A | 3/2014 | |
| JP | 2015-211480 | A | 11/2015 | |
| JP | 2015-225723 | A | 12/2015 | |
| JP | 6173922 | B2 * | 8/2017 | ............ B60L 11/005 |
| JP | 2017-189045 | A | 10/2017 | |
| WO | 2015/087375 | A1 | 6/2015 | |
| WO | WO-2016132586 | A1 * | 8/2016 | .......... H01M 10/425 |
| WO | WO-2017170683 | A1 * | 10/2017 | ........ H01M 10/0525 |
| WO | 2018/147194 | A1 | 8/2018 | |

* cited by examiner

POWER STORAGE CONTROL SYSTEM AND POWER STORAGE CONTROL METHOD

CROSS-REFERENCE TO RELATED APPLICATIONS

This application claims benefit of priority to International Patent Application No. PCT/JP2020/008133, filed Feb. 27, 2020, and to Japanese Patent Application No. 2019-054984, filed Mar. 22, 2019, the entire contents of each are incorporated herein by reference.

BACKGROUND

Technical Field

The present disclosure relates to a power storage control system and a power storage control method.

Background Art

In recent years, power storage systems are widely used by users such as businesses operating a factory or the like, and general consumers living in a residence. As the method of using the power storage system, for example, the power generation device using a renewable energy for which a solar photovoltaic device is representative, and a power storage system are connected, and a storage battery is charged by the excess amount of generated electrical power that is not being consumed. Alternatively, in time slots such as nighttime in which the cost of commercial electrical power supplied by the electric power company is cheaper, the storage battery is charged with this cheap commercial electrical power.

Then, the electrical power charged in the storage battery is used in a time slot in which electrical power generation amount is insufficient, time slot in which the commercial electrical power is expensive, during power outage occurrence or the like. A user such as a business or general consumer thereby becomes able to reduce the total amount of electrical power cost of commercial electrical power, and be prepared for power outage in advance. Technology related to such a power storage system is disclosed in Japanese Unexamined Patent Application, Publication No. 2017-189045, for example.

SUMMARY

However, each cell constituting a storage battery of a storage battery system deteriorates accompany the repetition of charging and discharging, and aging. For this reason, the storage capacity of the storage battery gradually decreases. However, it is not being assumed to replace only the deteriorated part of the cells of the storage battery with a normal power storage system. For this reason, it is necessary for the user to continue use of the power storage system while the storage capacity is decreased, or do maintenance by replacing the existing power storage system entirely with a new power storage system.

Therefore, for example, in the case of an application requiring to always ensure at least a certain storage capacity during an operating period of the storage battery system, it is necessary for the user to calculate excessively the necessitated storage capacity, by considering the decrease in storage capacity due to future deterioration. Then, it is necessary to install storage batteries of the amount commensurate with this extra storage capacity. In this case, the initial investment cost for installation of the power storage system increases. In addition, in order to avoid this, in the case of the user installing storage batteries with a low estimate for the extra amount, the storage capacity will be insufficient at an early stage during the operating period, and the necessity arises to replace the entire power storage system at an early stage; therefore, the maintenance cost increases.

The present disclosure was made taking account of such a situation. Accordingly, the present disclosure provides a power storage control system and power storage control method capable of further reducing the operating cost of a power storage system.

A power storage control system according to the present disclosure includes a monitoring unit which monitors a predetermined index value having a correlation with a deterioration extent of a storage battery, for each storage battery included in a plurality of power storage systems; and a charge/discharge control unit which controls a period in which the predetermined index value changes to a predetermined value of each of the storage batteries due to deterioration accompanying charging and discharging of the storage batteries, by performing control related to at least either of a charge amount or charge/discharge speed in charging and discharging of the storage battery, based on monitoring results of the monitoring unit.

A power storage control method according to the present disclosure is a power storage method executed by a power storage control system. The method includes the steps of monitoring a predetermined index value having a correlation with a deterioration extent of a storage battery, for each storage battery included in a plurality of power storage systems; and controlling a period in which the predetermined index value changes to a predetermined value for each of the storage batteries due to deterioration accompanying charging and discharging of the storage battery, by performing control related to at least either of charge amount or charge/discharge speed in charging and discharging of the storage battery, based on monitoring results of the monitoring step.

According to the present disclosure, it becomes possible to further reduce the operating cost of a power storage system.

DETAILED DESCRIPTION

Hereinafter, an example of an embodiment of the present disclosure will be explained by referencing the attached drawings.

System Configuration

Figure 1:
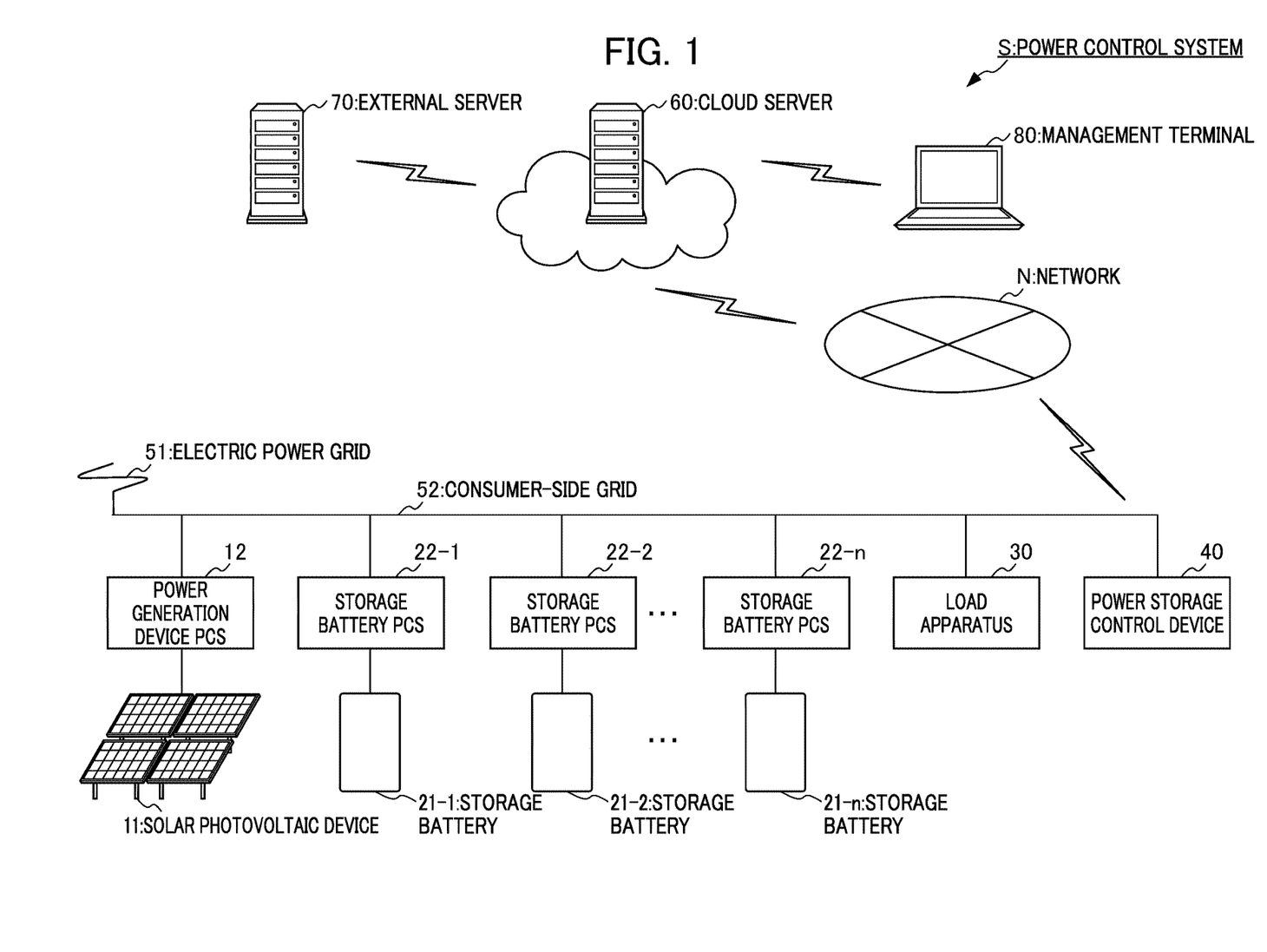
FIG. 1 is a block diagram showing an example of the overall configuration of a power storage control system according to an embodiment of the present disclosure.

FIG. 1 is a block diagram showing the overall configuration of a power storage control system S according to the present embodiment. As shown in FIG. 1, the power storage control system S includes: a solar photovoltaic device 11; a power generation device power conditioner 12; a plurality of storage batteries 21; a plurality of storage battery power conditioners 22; a load apparatus 30; a power storage control device 40; an electric power grid 51; consumer-side wiring 52; a cloud server 60; an external server 70; and a management terminal 80. It should be noted that the "power conditioner" is noted as "PCS" in the drawings.

In addition, as the plurality of storage batteries 21, the drawing illustrates a storage battery 21-1, storage battery 21-2, . . . and storage battery 21-*n*. In addition, the drawing illustrates a storage battery power conditioner 22-1, storage battery power conditioner 22-2, and storage battery power conditioner 22-*n*, corresponding to these storage batteries 21. However, in the case of explaining these without particularly distinguishing therebetween, hereinafter, the end of the reference number is omitted, and an explanation is provided by calling as "storage battery 21" and "storage battery power conditioner 22".

Herein, the solar photovoltaic device 11; power generation device power conditioner 12; storage battery 21; storage battery power conditioner 22; load apparatus 30; and power storage control device 40 are used by installing in the lot of the consumer, for example. Herein, this consumer may be a business that operates a factory or the like, or may be a general consumer who uses a house.

The consumer-side wiring 52 connected with the electric power grid 51 by power system interconnection type is constructed in this lot of the consumer. Then, the solar photovoltaic device 11; power generation device power conditioner 12; storage battery 21; storage battery power conditioner 22; load apparatus 30; and power storage control device 40 are connected in parallel to the AC terminals of this consumer-side wiring 52, and are driven by receiving the supply of the generated electrical power generated by the solar photovoltaic device 11 or the purchased electrical power which was purchased from the electric power company via the electric power grid 51. In addition, each of the storage battery 21 and storage battery power conditioner 22 are made into a group with the end of the reference number in common, and each of these groups functions as a power storage system. Then, this power storage system performs power storage by receiving the supply of generated electrical power generated by the solar photovoltaic device 11 or purchased electrical power purchased from the electric company via the utility grid 51.

The cloud server 60 and external server 70 are used by the operation business of a power storage control system S. The management terminal 80 is used by the operation business of the power storage control system S or a consumer. In addition, each apparatus included in the power storage control system S is connected to each other to be able to communicate via a network N.

The power storage control system S having such a configuration monitors a predetermined index value having a correlation with the deterioration extent of the storage battery 21, for each of the storage batteries 21 included in the plurality of power storage systems. In addition, the power storage control system S controls the period for which the predetermined index value of each storage battery 21 changes to a predetermined value due to deterioration accompanying charging and discharging of the storage battery 21 (for example, deterioration of the storage battery 21 advances and period when storage battery 21 should be replaced), by performing control of charge/discharge of the storage battery 21 (for example, control related to at least either of charge amount or charge/discharge speed in charging and discharging) based on the monitoring results. The power storage control system S thereby exerts many effects such as those explained below.

As a premise, the general technology performs charge/discharge control evenly on each storage battery of a plurality of power storage systems, in a case of jointly providing storage batteries for which at least one of the performance of the storage battery such as storage capacity and deterioration characteristic, producer of the storage battery (i.e. manufacturer) and deterioration state of the storage battery differs therebetween. Therefore, the general technology, in the case of jointly providing a storage battery for which such performance, etc. differs therebetween, it has been very difficult to control the deterioration of each storage battery as intended. For this reason, with the general technology, there has been a possibility of only a part of the storage batteries undergoing unintended deterioration, such as early deterioration. However, according to the power storage control system S, the appropriate charge/discharge control is performed on each of the storage batteries 21 based on the monitoring results for each storage battery 21 of the plurality of power storage systems. It thereby exerts an effect of being able to resolve the problem of the general technology in that the storage battery undergoes unintended deterioration, and to appropriately use a plurality of power storage systems.

In addition, according to the power storage control system S, it is possible to appropriately use a plurality of power storage system in this way. For this reason, even without calculating the reduction in power storage capacity by considering the decrease in storage capacity due to future deterioration as in the general technology, it is possible to install storage batteries of the amount commensurate with the necessary storage capacity, and sequentially replace only the deteriorated part of the power storage system. It thereby exerts an effect of being able to reduce the initial investment cost for installation of the power storage system. In addition, for example, it also exerts an effect of being able to recover the capacity by simply adding a low capacity power storage system, without replacing the high capacity power storage system, in the case of a high capacity power storage system deteriorating and not being able to ensure the required power storage capacity.

Furthermore, according to the power storage control system S, it is possible to perform control of replacement time, as mentioned above. For example, it is possible to perform control to distribute replacement times. It thereby exerts an effect of being able to prevent the necessity for replacing all of the plurality of power storage systems at one time from arising, and thus a large sum of maintenance costs arising at one time. In addition, it exerts an effect of suppressing the risk of all of the power storage system deteriorating at the same time, and the power storage capacity becoming deficient at once. In other words, according to the power storage system S, it is made possible to further reduce various operating costs such as initial investment cost and maintenance cost of the power storage system, and more appropriately use the plurality of power storage systems.

Next, each apparatus included in the power storage control system S will be explained in further detail. The solar photovoltaic device 11 is a device which performs power generation by converting the solar energy of sunlight into electricity by the photovoltaic effect. By defining a solar string made by connecting a solar cell module in series as one circuit, and connecting each circuit to a connection box, the solar photovoltaic device 11 consolidates DC current generated by each solar cell module into one. This DC current consolidated into one is outputted to the power generation device power conditioner 12 via diodes, switches, etc. for backflow prevention in the connection box.

The power generation device power conditioner 12 includes an inverter which converts the DC current outputted from the solar photovoltaic device 11 to AC current which is generally used at facilities, residences, etc. The AC current converted by the power generation power conditioner 12 is supplied to the storage battery power conditioner 22, load apparatus 30 and power storage control device 40.

The storage battery 21 is a secondary battery which stores electrical power. The storage battery 21 stores electrical power, by the storage battery power conditioner 22 conducting charging on the storage battery 21. By the electrical power stored in this storage battery 21, it is possible to use the load apparatus 30 during power outage, or use the surplus power generated during the day at night, for example. In addition, it is possible to charge with the low cost nighttime electrical power and use during the day. It should be noted that each storage battery 21 may be the same type of storage battery as each other; however, they may be storage batteries for which at least one of the performance of the storage battery such as storage capacity and deterioration characteristic, producer of the storage battery (i.e. manufacturer) and deterioration state of the storage battery differs therebetween. In other words, storage batteries having such performance, etc. differing may coexist as the respective storage batteries 21.

The storage battery power conditioner 22 includes an inverter which converts the DC current of electrical power stored in the storage battery 21 into AC current generally used in residences, etc. The AC current converted by the storage battery power conditioner 22 is supplied to the load apparatus 30 and power storage control device 40.

The load apparatus 30 includes a plurality of electrical equipment which operate by the electrical power generated by the solar photovoltaic device 11, and electrical power purchased (i.e. power purchase) from the electric power company. The electrical equipment included in the load apparatus 30 are not particularly limited, and electrical equipment such as various machines operating in factories, air-conditioning, or a refrigerator, television and electric water heater (for example, EcoCute) are included in the load apparatus 30.

The power storage control device 40 controls charging and discharging of each storage battery 21, by controlling each storage battery power conditioner 22, based on the control settings determined by the cloud server 60 based on the monitoring results.

In addition, the power storage control device 40 collects various state information related to the operating state of the power storage system and solar photovoltaic device 11. The power storage control device 40, as the state information, collects predetermined index values having a correlation with the deterioration extent of the storage battery 21, for each of the storage batteries 21, from each of the storage battery power conditioners 22, for example. This predetermined index value is any or a combination of a value of SOH (State of Health) indicating the change amount of the current power storage capacity from the initial power storage capacity, integrated value of the charged electrical power amount or discharged electrical power amount to the storage battery 21, integrated value of the SOC (state of charge) which is a value indicating the increase or decrease in charge amount of the storage battery 21, and value of cumulative time for which the storage battery 21 was a high-temperature state.

In addition, as another example, the power storage control device 40 collects the state of each of the storage battery power conditioners 22 themselves, from each of the storage battery power conditions 22 as state information. For example, it collects the value, etc. for cumulative time for which the storage battery power conditioner 22 was a high-temperature state.

Furthermore, as another example, the power storage control device 40 collects the past record of generated electrical power amount of the solar photovoltaic device 11 via the power generation device power conditioner 12, as state information. In addition, the power storage control device 40 collects past records of power consumption by monitoring the electrical power supplied to the storage battery 21, load apparatus 30 and power storage control device 40, as state information. Furthermore, the power storage control device 40 collects past records of purchased electrical power amount (purchased electric amount), by monitoring the electric power grid, as state information. The power storage control device 40 sends the state information collected in this way to the cloud server 60.

The cloud server 60 monitors a predetermined index value having a correlation with the deterioration extent of the storage battery 21 included in the state information received from the power storage control device 40. In addition, the cloud server 60 performs control of the period at which the predetermined index value of each of the storage batteries 21 changes to the predetermined value (for example, deterioration of the storage battery 21 advances and period when storage battery 21 should be replaced) according to deterioration accompanying charge and discharge of the storage battery 21, by controlling the charge/discharge of the storage battery 21 based on the monitoring results. As an example for explanation in the present embodiment, the cloud server 60 performs control to distribute the periods for which the predetermined index value of each storage battery 21 changes to a predetermined value according to deterioration accompanying charge and discharge of the storage battery 21 (for example, deterioration of the storage battery 21 advances and period when storage battery 21 should be replaced), by performing control related to at least either of the charge amount or the charge/discharge speed in charging/discharging of the storage battery 21. For this reason, the cloud server 60 sends, to the power storage control device 40, the control settings which are parameters for executing control of charging/discharging of such a storage battery 21, based on the monitoring results. The power storage control device 40 controls the charging/discharging of each storage battery 21, by controlling each storage battery power conditioner 22, based on these control settings as mentioned above.

The power storage control system S thereby exerts many effects as mentioned above, to be able to distribute the periods at which the predetermined index value charges to the predetermined value (for example, deterioration of the storage battery 21 advances and period when storage battery 21 should be replaced). It should be noted that further details of this power storage control device 40 and cloud server 60 are described later by referencing FIGS. 2 and 3.

The external server 70 is a server which provides equipment information, which is information of each equipment included in the power storage control system S, as information for the cloud server 60 to generate the control settings. The external server 70 sends, to the cloud server 60, the equipment information of each equipment such as the solar photovoltaic device 11, power generation device power conditioner 12, storage battery 21 and storage battery power conditioner 22. The equipment information, for example, is information such as the specification of each equipment, price of each equipment, installation cost of each equipment, expansion cost of each equipment, and maintenance cost of each equipment. In addition, the external server 70, for example, is realized by a server of the manufacturer of each equipment, or the business performing the maintenance. Alternatively, the external server 70 may be a server operated by the operator business themselves of the power storage control system S, maintenance business affiliated with this operator business, etc.

The management terminal 80 is a terminal for managing the cloud server 60. The operation business or consumer of the power storage control system S can reference the state, equipment information or the like stored by the cloud server 60, by using the management terminal 80. In addition, using the management terminal 80, the operation business or consumer can record or update in the cloud server 60 the information related to installation of each apparatus used by the consumer (e.g., model, installation period of each apparatus installed), and information such as the contract terms with the electric power company. Furthermore, using the management terminal 80, the operation business or consumer can perform various settings such as a standard for determining control settings. For example, it is possible to perform setting of distributed period in which the predetermined index value having a correlation with the deterioration extent of the storage battery 21 should be changed to the predetermined value.

The network N, for example, is realized by any of the Internet, LAN (Local Area Network) and phone network system, or a network made by combining these. The communication between equipment via the network N may be performed compliant to any communication method, and this communication method is not particularly limited. In addition, the communication between each equipment may be performed directly between equipment without going through the network N. For example, communication between the power storage control device 40 and each other equipment connected to the consumer-side wiring 52 may be performed directly using signal wire which is omitted from the drawings.

An explanation has been provided for each apparatus included in the power storage control system S above. It should be noted that the configurations shown in the drawings are examples at the very most, and are not to be limited thereto. For example, in the drawings, although each apparatus is illustrated as one unit each other than the respective storage batteries 21 and respective storage battery power conditioners 22 constituting the power storage system, this is merely an exemplification, and each of these apparatuses may be included in any number of units in the power storage control system S.

In addition, in the drawings, the power generation device power conditioner 12 and storage battery power conditioner 22 are provided as separate bodies corresponding to the solar photovoltaic device 11 and storage battery 21; however, it is not to be limited thereto. For example, with one hybrid-type power conditioner corresponding to the solar photovoltaic device 11 and storage battery 21, it may be configured so as to realize the power generation device power conditioner 12 and storage battery power conditioner 22.

Furthermore, in the drawings, each of the storage battery 21 and storage battery power conditioner 22 are made into a group with the end of the reference number in common, and each of these groups construct a power storage system; however, it is not to be limited thereto. For example, one power storage power conditioner 22 of a certain manufacturer and a plurality of storage batteries 21 of this manufacturer may be made into a group in a one-to-many relationship, and this group may construct the power storage system.

Furthermore, the present embodiment assumes a case of performing power generation using sunlight as the renewable energy; however, this also is merely one example for explanation. The present embodiment can also be applied to a case of performing power generation using renewable energy other than sunlight, such as wind power, hydro power, geothermal energy and biomass.

Configuration of Power Storage Control Device

Figure 2:
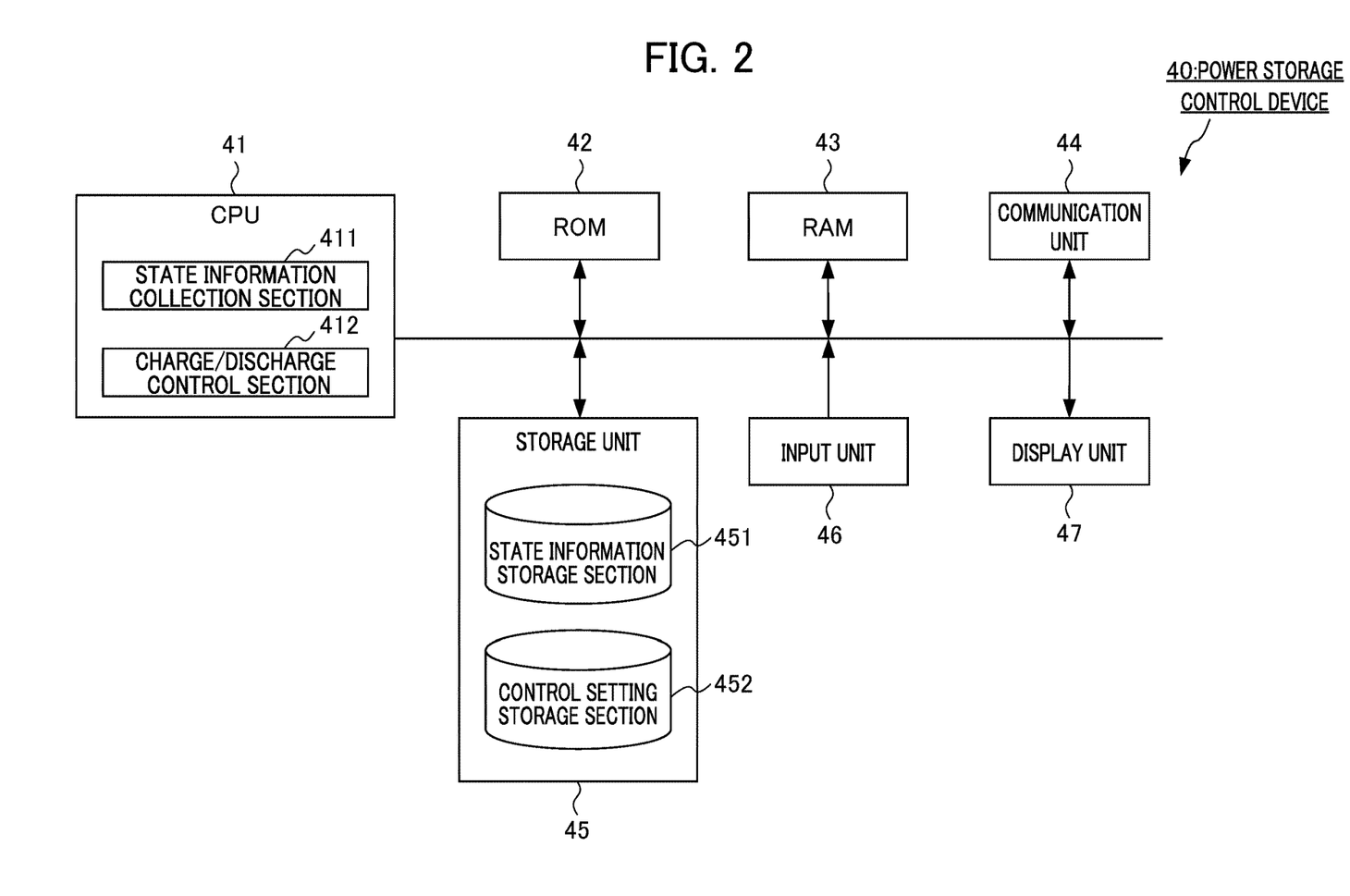
FIG. 2 is a block diagram showing an example of the configuration of a power storage control device according to an embodiment of the present disclosure.

Next, an explanation will be provided for the configuration of the power storage control device 40 by referencing the block diagram of FIG. 2. As shown in FIG. 2, the power storage control device 40 includes: a CPU (Central Processing Unit) 41, ROM (Read Only Memory) 42, RAM (Random Access Memory) 43, communication unit 44, storage unit 45, input unit 46 and display unit 47. Each of these parts is bus connected by signal wire, and send/receive signals with each other.

The CPU 41 executes various processing in accordance with programs recorded in the ROM 42, or programs loaded from the storage unit 45 into the RAM 43. Data, etc. required upon the CPU 41 executing the various processing is stored as appropriate in the RAM 43.

The communication unit 44 performs communication control for the CPU 41 to perform communication with other devices included in the power storage control system S. The storage unit 45 is configured by semiconductor memory such as DRAM (Dynamic Random Access Memory), and stores various data.

The input unit 46 is configured by external input devices such as various buttons and a touch panel, or a mouse and keyboard, and inputs various information in response to instruction operations of the user. The display unit 47 is configured by a liquid crystal display or the like, and displays images corresponding to image data outputted by the CPU 41.

In addition, in the case of the power storage control device 40 performing operation processing unique to the present embodiment, a state information collection section 411 and charge/discharge control section 412 function in the CPU 41, as shown in FIG. 2. In addition, a state information storage section 451 and control setting storage section 452 are established in a region of the storage unit 15.

The state information storage section 451 stores various state information related to the operation state of the power storage system and/or solar photovoltaic device 11 collected by a state information collection section 411 described later. The control setting storage section 452 stores the control settings received from the cloud server 60.

The state information collection section 411 collects various state information related to the operating state of the power storage system and solar photovoltaic device 11, from the storage battery power conditioner 22 or power generation device power conditioner 12. The state information is the information mentioned above by referencing FIG. 1, and is a predetermined index value or the like having a correlation with the deterioration extent of the storage battery 21, for example.

It should be noted that the state information collection section 411 may acquire state information from a wattmeter in the residence which measures the electrical power, or a smart meter installed by an electric power company. In addition, the state information collection section 411 may connect to HEMS (Home Energy Management System), and collect state information from the HEMS. Furthermore, the state information collection section 411 may collect the state information, by communication compliant to a standard such as ECHONET Lite (registered trademark) from electrical equipment included in the load apparatus 30.

Alternatively, the state information collection section 411 may further include a function as a wattmeter consisting of a pair of a fixed coil and moving coil, for example. Then, the state information collection section 411 may acquire state information, by the state information collection section 411 itself executing measurement by the function of this wattmeter.

The state information collection section 411 causes the collected state information to be stored in the state information storage section 451. In addition, the state information collection section 411 sends state information stored in the state information storage section 451 to the cloud server 60 based on predetermined conditions, upon associating with identification information of the power storage control system and/or the solar photovoltaic device 11. For example, the state information collection section 411 sends the state information to the cloud server 60 at predetermined time intervals.

It should be noted that the sending of state information to the cloud server 60 may be performed by the state information collection section 411 in this way, but is not limited thereto. For example, the state information may be sent directly to the cloud server 60 from each apparatus (power storage control system, solar photovoltaic device 11, etc.) other than the power storage control device 40, without going through the state information collection section 411.

The charge/discharge control section 412 acquires setting information by receiving setting information from the cloud server 60. These control settings are controls settings determined by the cloud server 60 based on the monitoring results as mentioned above. Then, the charge/discharge control section 412 causes the acquired setting information to be stored in the control setting storage section 452. In addition, the charge/discharge control section 412 performs control of charging/discharging of the storage battery 21, by controlling the storage battery power conditioner 22 included in the power storage system, based on the control settings stored by the control setting storage section 452.

Configuration of Cloud Server 60

Figure 3:
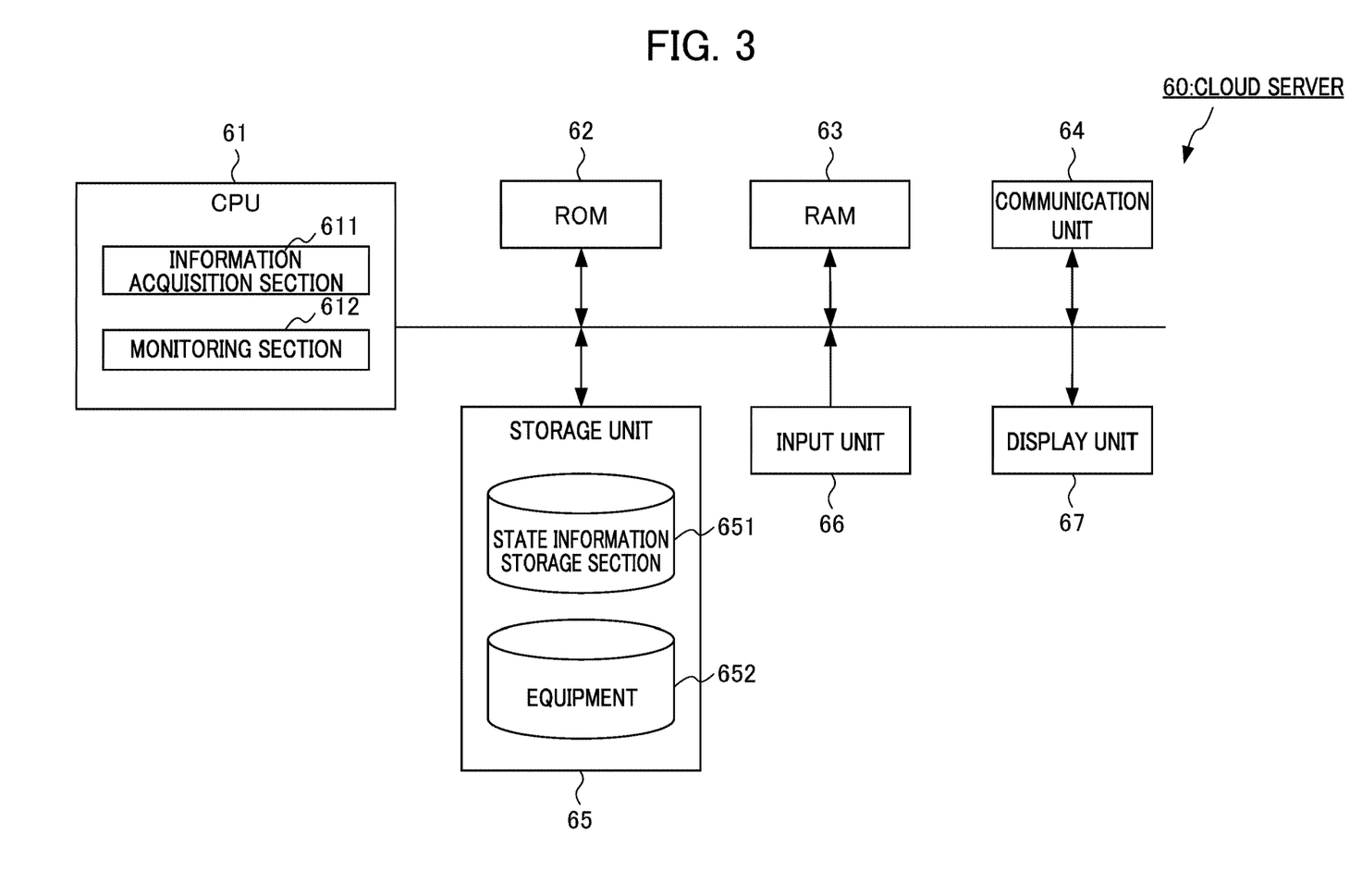
FIG. 3 is a block diagram showing an example of the configuration of a cloud server according to an embodiment of the present disclosure.

Next, an explanation is provided for the configuration of the cloud server 60 by referencing the block diagram of FIG. 3. As shown in FIG. 3, the cloud server 60 includes a CPU 61, ROM 62, RAM 63, communication unit 64, storage unit 65, input unit 66 and display unit 67. Each of these parts is bus connected by signal wire, and send/receive signals with each other.

Herein, a function as hardware of each of these parts is equivalent to the function as hardware of each part of the same name with only the reference number differing, possessed by the aforementioned power storage control device 40. Therefore, redundant explanations will be omitted.

In addition, in the case of the cloud server 60 performing operation processing unique to the present embodiment, the information acquisition section 611 and monitoring section 612 function in the CPU 61, as shown in FIG. 3. In addition, a state information storage section 651, and equipment information storage section 652 are established in a region of the storage unit 65.

The state information storage section 651 stores various state information acquired from the power storage control device 40 by the information acquisition section 611 described later, information related to the installation of each apparatus used by the consumer acquired from the management terminal 80, and information such as contract terms with the electric power company.

The equipment information storage section 652 stores equipment information acquired by the information acquisition section 611 described later from the external server 70. The equipment information is the information mentioned above by referencing FIG. 1, for example, and is information such as the spec of each equipment, price of each equipment, installation cost of each equipment, expansion cost of each equipment, and maintenance cost of each equipment.

The information acquisition section 611 acquires state information stored by the aforementioned state information storage section 651, and equipment information stored by the aforementioned equipment information storage section 652. More specifically, the information acquisition section 611 acquires this information, by performing communication with the power storage control device 40 and external server 70 via the network N. The information acquisition section 611 causes the acquired state information and equipment information to be respectively stored in the state information storage section 651 and equipment information storage section 652.

The monitoring section 612 monitors the predetermined index value having a correlation with the deterioration extent of the storage battery 21 included in the state information acquired by the information acquisition section 611 and stored in the state information storage section 651. In addition, the monitoring section 612 distributes the periods in which the predetermined index value of each storage battery 21 changes to a predetermined value according to deterioration accompanying charge and discharge of the storage battery 21 (for example, deterioration of the storage battery 21 advances and period when storage battery 21 should be replaced), by performing control of charge/discharge of the storage battery 21 based on the monitoring results. For this reason, the monitoring section 612 determines the control settings which are parameters for executing control of charging/discharging of such a storage battery 21 based on the monitoring results, and sends the determined control settings to the power storage control device 40.

Herein, a determination method of control settings by the monitoring section 612 will be explained. The monitoring section 612 distributes the period in which the predetermined index value changes to the predetermined value as mentioned above. For this reason, the user performs setting of the distributed periods in which the predetermined index value should change to the predetermined value, from the management terminal 80, for example. In addition, setting of which value to use as the predetermined index value, setting of how much to set the predetermined value, etc. is performed from the management terminal 80. Then, the monitoring section 612 determines the control settings, based on the this set period, predetermined index value, and/or predetermined value.

As an example of setting, it is set so as to use the value of SOH indicating the change rate of the current power storage capacity from the initial power storage capacity as the predetermined index value. Herein, due to indicating that the storage battery 21 is deteriorating as the value of SOH declines, the predetermined value in this case is set to a value smaller than the initial value for SOH.

Alternatively, it is set so as to use, as the predetermined index value, any or a combination of the integrated value of the charged electrical power amount or discharged electrical power amount to the storage battery 21, integrated value of the SOC which is a value indicating the increase or decrease in charge amount of the storage battery 21, and value of cumulative time for which the storage battery 21 was a high-temperature state. Herein, since these show that the storage battery 21 is deteriorating as the integrated value of the charged electrical power amount or discharged electrical power amount to the storage battery 21, integrated value of the SOC which is a value indicating the increase or decrease in charge amount of the storage battery 21, and value of cumulative time for which the storage battery 21 was a high-temperature state rises, the predetermined value in this case is set to a value larger than the initial value of these values.

It should be noted that, in this case, the monitoring section 612 appropriately uses the equipment information stored by the aforementioned equipment information storage section 652, in order to calculate these predetermined index values. For example, it appropriately uses information such as the initial storage capacity and charging characteristic of the storage battery 21 included in the equipment information, in order to calculate SOH.

Then, the monitoring section 612 determines control settings so as to perform control of charging/discharging so that deterioration of this storage battery 21 is delayed, in the case of these predetermined index values changing to approach the predetermined value, and becoming the predetermined value earlier than the set predetermined period, by the deterioration advancing faster than assumed in any of the storage batteries 21. For example, as the control related to the charging amount in charging/discharging so that deterioration of this storage battery 21 is delayed, the control settings are determined so as to perform either or both of control to decrease the upper limit and control to raise the lower limit for the charging amount of this storage battery 21. Alternatively, as control of charging/discharging so that deterioration of this storage battery 21 is delayed, as control related to charging/discharging speed in charging/discharging of this storage battery 21, the control settings are determined so as to perform either or both of control to decrease charging speed and control to decrease the discharging speed of this storage battery 21.

In addition, the monitoring section 612 further determines control settings so as to perform the opposite control to the aforementioned control of charge/discharge, so that the deterioration of this storage battery 21 comes sooner, in the case of the rate at which these predetermined index values change and approach the predetermined values being slow, and the storage battery 21 becoming the predetermined value later than the set predetermined period, due to deterioration not progressing as assumed in any of the storage batteries 21.

Then, the monitoring section 612 sends the control settings determined in this way to the power storage control device 40. The charge/discharge control section 412 of the power storage control device 40 controls the charging/discharging of each storage battery 21, by controlling each storage battery power conditioner 22, based on these control settings as mentioned above.

By determining the control settings in this way and performing control of charging/discharging based on these, it is possible to distribute the periods in which the predetermined index value changes to the predetermined value. It should be noted that the monitoring and determination of control settings by such a monitoring section 612 may be configured to be performed at predetermined cycles. Then, the charge/discharge control section 412 may be configured so as to control the charging/discharging of each storage battery 21, by controlling each storage battery power conditioner 22, based on the control settings based on these monitoring results, every time the control settings are determined in a predetermined cycle in this way.

In addition, in the case of entering the set predetermined period in any of the storage batteries 21, and the predetermined index value declining to the predetermined value, the monitoring section 612 may be configured to send the fact that a storage battery 21 for which the replacement time arrived due to deterioration to the power storage control device 40 and/or management terminal 80. The user using the power storage control device 40 or management terminal 80 can thereby know the storage battery 21 for the replacement time has arrived due to deterioration.

In addition, for example, the monitoring section 612 may be further configured so as to estimate the replacement time of components (for example, electrolytic capacitor) which deteriorate in a high-temperature state in the storage battery power conditioner 22, based on the value of cumulative time for which the storage battery power conditioner 22 was a high-temperature state included in the state information. Then, the monitoring section 612 may be configured so as to send, to the power storage control device 40 and/or management terminal 80, this estimated replacement time of the electrolytic capacitor or the like. The user using the power storage control device 40 or management terminal 80 can thereby understand that an electrolytic capacitor for which the replacement time has arrived is present.

Operation Processing

A detailed explanation was provided above for the configurations of the power storage control device 40 and cloud server 60. Next, the flow of operation processing executed by the present embodiment will be explained by referencing the flowchart of FIG. 4. It should be noted that the sending of equipment information to the cloud server 60 by the external server 70, management of settings to the cloud server 60 by the management terminal 80, etc. are executed as appropriate in parallel with the processing shown in the flowchart of FIG. 4.

Figure 4:
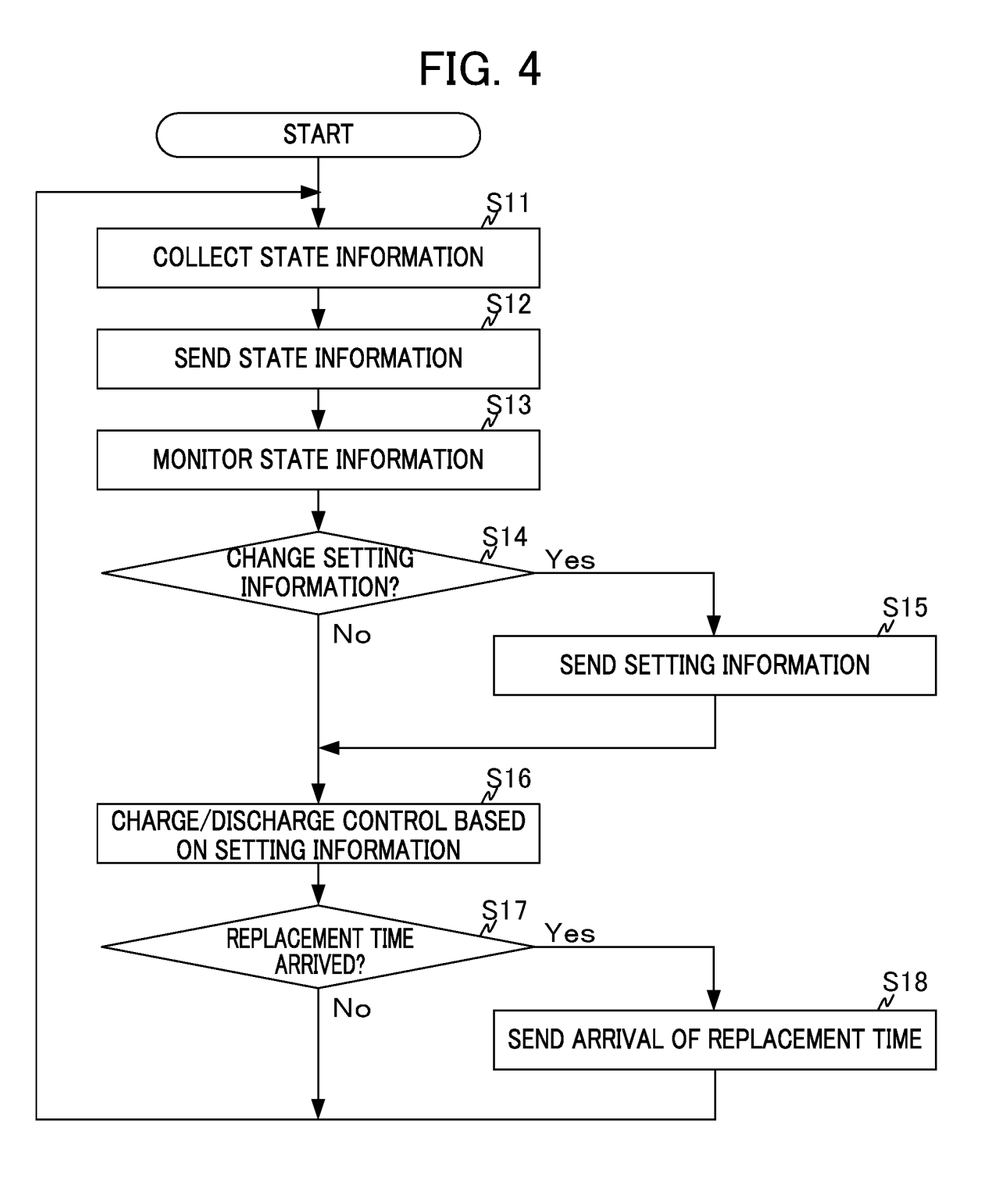
FIG. 4 is a flowchart for explaining the flow of operation processing executed by a power storage control system according to an embodiment of the present disclosure.

In Step S11, the state information collection section 411 collects the state information. In Step S12, the state information collection section 411 sends the state information collected in Step S11 to the cloud server 60. This state information is acquired by the information acquisition section 611.

In Step S13, the monitoring section 612 monitors the state information acquired from the information acquisition section 611. In Step S14, the monitoring section 612 determines whether to change the setting information based on the change in predetermined index value, etc. as mentioned above. In the case of determining to change the setting information, it is determined as YES in Step S14, and the processing advances to Step S15. On the other hand, in the case of determining not to change the setting information, it is determined as NO in Step S14, and the processing advances to Step S16.

In Step S15, the monitoring section 612 generates setting information based on the determination result of Step S14, and sends the generated setting information to the power storage control device 40. This setting information is acquired by the charge/discharge control section 412.

In Step S16, the monitoring section 612 performs charge/discharge of the storage battery 21, by controlling the storage battery power conditioner 22 included in the power storage system, based on known setting information stored in the control setting storage section 452, or setting information acquired in Step S15.

In Step S17, the monitoring section 612 determines whether entering the set predetermined period, and a storage battery 21 for which the replacement time arrived due to deterioration is present. In the case of a storage battery 21 for which the replacement time has arrived being present, it is determined as YES in Step S17, and the processing advances to Step S18. On the other hand, in the case of a storage battery 21 for which the replacement time has arrived not being present, it is determined as NO in Step S17, and the processing returns to Step S11. Then, the aforementioned processing is repeated.

In Step S18, the monitoring section 612 sends, to the power storage control device 40 and/or management terminal 80, the fact that a storage battery 21 for which the replacement time arrived due to deteriorating is present. The user using the power storage control device 40 and/or management terminal 80 can thereby know the storage battery 21 for which replacement time has arrived due to deteriorating. In this Step S17 and Step S18, for example, it may be configured so that the replacement time for the aforementioned electrolytic capacitor, etc. is also sent to the power storage control device 40 and/or management terminal 80.

According to the operation processing explained above, it is possible to exert effects such as reducing various operating costs such as the initial investment cost and maintenance cost of the aforementioned power storage system, and more appropriately use a plurality of power storage system.

Modified Examples

Although an embodiment of the present disclosure has been explained above, this embodiment is merely an exemplification, and is not to limit the technical scope of the present disclosure. The present disclosure can assume various other embodiments, and various modifications such as omissions and substitutions can be performed within a scope not departing from the gist of the present disclosure. These embodiments and modifications thereof are encompassed in the scope and gist of the disclosure described in the present disclosure, and encompassed in the scope of the disclosure and equivalents thereto described in the claims. For example, embodiments of the present disclosure may be modified as in the following modified examples.

First Modified Example

The aforementioned embodiment uses a predetermined value, etc. set by the user using the power storage control device 40 or management terminal 80, as a standard for determining the control settings based on the monitoring results of the state information. It is not limited thereto, and may be configured so as to set the standard for determining the control settings based on the monitoring results of the state information by machine learning. In this case, the cloud server 60 performs machine learning for more appropriately performing control of charging/discharging of the storage battery 21, based on the past records of change in the predetermined index value of each of the storage batteries 21 accompanying executing control of charging/discharging of the storage battery 21 in the aforementioned way.

The technique of this machine learning is not particularly limited, and any technique can be adopted. For example, with the control settings as teaching data upon succeeding in distributing the periods in which the predetermined index value of each storage battery 21 changes to the predetermined value, for example, it may be configured so as to perform machine learning using general supervised (or semi-supervised) machine learning algorithm such as deep learning. Then, the monitoring section 612 determines the control settings based on a learning model created by this machine learning. It is thereby possible to continue control of charging/discharging of the storage battery 21, based on the results of machine learning.

Second Modified Example

The aforementioned embodiment monitored actual values of state information collected by performing measurement, etc. with the power storage control device 40, and performed determination of control settings based on this monitoring of actual values. It is not limited thereto, and may be configured so as to estimate future state information, and perform determination of future control settings, based on this estimated future state information, for example. In this case, for example, the monitoring section 612 estimates future state information, based on the transition of actual values of past state information. Alternatively, the monitoring section 612 estimates the future state information, based on an operating schedule of the load apparatus 30 (for example, factory operation schedule) determined by the user using the power storage control device 40 or management terminal 80.

Then, the monitoring section 612 performs determination of future control settings, based on this estimated future state information. It thereby becomes possible to perform control of charging/discharging of the storage battery 21, prior to actual deterioration of the storage battery 21.

Third Modified Example

The aforementioned embodiment provides the cloud server 60, and performs the monitoring of state information, and the generation of control settings based on this monitoring, with the cloud server 60. It is not limited thereto, and may be configured so as to implement a part or the entirety of these functions of the cloud server 60 in the power storage control device 40. In addition, it may be configured so as to combine the aforementioned first modified example or second modified example with the third modified example, and implement a part or all of the function of performing machine learning or function of estimating the future state information in the power storage control device 40.

Fourth Modified Example

In the aforementioned embodiment, the consumer-side wiring 52 connected with the electric power grid 51 by power system interconnection type is constructed within the lot of the consumer. In addition, the solar photovoltaic device 11 and power generation device power conditioner 12 are installed. Then, the power storage system performs power storage by receiving the supply of generated electrical power generated by the solar photovoltaic device 11 or purchased electrical power purchased from the electric power company via the electric power grid 51. It is not limited thereto, and may be configured to perform power storage from only either of the generated electrical power generated by the solar photovoltaic device 11 and purchased electrical power purchased from the electric power company via the electric power grid 51.

In this case, it may be configured so as to omit the solar photovoltaic device 11 and power generation device power conditioner 12. Alternatively, the consumer-side wiring 52 may not necessarily be connected to the electric power grid 51. In other words, it is possible to realize the aforementioned present embodiment so long as any of the electric power grid 51 or power generated by renewable energy such as the solar photovoltaic device 11 is present.

Fifth Modified Example

The aforementioned embodiment does control of distributing the periods in which the predetermined index value of each storage battery 21 changes to a predetermined value according to deterioration accompanying charging and discharging of the storage battery 21 (for example, deterioration of the storage battery 21 advances and period when storage battery 21 should be replaced), by performing control of charging/discharging of the storage battery.

It is not limited thereto, and may be configured so as to perform control other than distribution control as the control of the period. For example, it may be configured so as to intentionally make a period in which the predetermined index value of each storage battery 21 changes to a predetermined value as the same period. Alternatively, for example, it may be configured so as to divide the storage batteries 21 into a plurality of groups, and intentionally make the period in which the predetermined index value of only the storage batteries 21 included in any group changes to the predetermined value as the same period. In other words, it may be configured so as to control any period in a form other than distribution, according to the demand of the operation business, consumer, etc. of the power storage control system S.

Other Modified Examples

As exemplified as the aforementioned first modified example to fourth modified example, the present disclosure is not limited to the aforementioned embodiments, and modifications, improvements, etc. in a scope which can achieve the object of the present disclosure are also encompassed by the present disclosure. In addition, in the aforementioned embodiment, an embodiment is realized by devices such as a cloud server; however, it is not particularly limited thereto, and it is possible to realize by common electronic equipment having an information processing function.

In addition, the aforementioned series of processing can be executed by hardware, or can be executed by software. In addition, one functional block may be configured by a single hardware unit, may be configured by a single piece of software, or may be configured by a combination of these. In other words, the functional configurations illustrated in FIGS. 2 and 3 are merely exemplifications, and are not limited thereto. In other words, it is sufficient if a function which can execute the aforementioned series of processing as a whole is provided to the power storage control system S, and which functional block is used in order to realize this function is not particularly limited to the examples of FIG. 2 and FIG. 3.

For example, the functional configurations included in the present embodiment can be realized by a processor which executes arithmetic processing, and the processors which can be employed in the present embodiment include, in addition to those configured by various processing devices singularly such as a single processor, multiple processor and multi-core processor, a processor in which these various processing devices and processing circuits such as ASIC (Application Specific Integrated Circuit) or FPGA (Field-Programmable Gate Array) are combined.

In the case of executing a series of processing by software, the programs constituting this software is installed in a computer or the like from a network or recording medium. The computer may be a computer built into dedicated hardware. In addition, the computer may be a computer capable of executing various function, for example, a general-purpose personal computer, by installing various programs thereto.

The recording medium containing such programs may be provided to the user by being distributed separately from the device main body in order to provide the programs to the user, or may be provided to the user in a state incorporated into the device main body in advance. The recording medium distributed separately from the device main body is configured by a magnetic disc (including floppy disc), optical disc, magneto-optical disc or the like. An optical disc, for example, is constituted by CD-ROM (Compact Disc-Read Only Memory), DVD (Digital Versatile Disc), Blu-ray (registered trademark) Disc (Blu-ray) or the like. A magneto-optical disc is constituted by MD (Mini-Disc) or the like. In addition, the recording medium provided to the user in a state incorporated into the device main body in advance is constituted, for example, by the ROM 42 of FIG. 2 and ROM 62 of FIG. 3 on which the programs are records, or a hard disk included in the storage unit 45 of FIG. 2 or storage unit 65 of FIG. 3.

It should be noted that, in the present disclosure, the steps defining the program recorded in the storage medium include not only the processing executed in a time series following this order, but also processing executed in parallel or individually, which is not necessarily executed in a time series. In addition, in the present specification, a term system shall mean a general device configured from a plurality of devices, a plurality of means, and the like.

What is claimed is:

1. A power storage control system comprising:
a monitor configured to monitor a predetermined index value having a correlation with a deterioration extent of a storage battery, for each storage battery included in a plurality of power storage systems; and
a charge/discharge controller configured to control a period in which the predetermined index value changes to a predetermined value of each of the storage batteries due to deterioration accompanying charging and discharging of the storage batteries, by performing control related to at least either of decreasing an upper limit for charge amount of the storage battery, or raising a lower limit for the charge amount of the storage battery, based on monitoring results of the monitoring.

2. The power storage control system according to claim 1, wherein
the charge/discharge controller is further configured to perform control to distribute periods in which the predetermined value changes to a predetermined value for each of the storage batteries included in the power storage system, as control of the period.

3. The power storage control system according to claim 1, wherein
the storage battery is a storage battery for which the predetermined index value has changed and approached the predetermined value, and the control is related to charge amount in charging and discharging of the storage battery.

4. The power storage control system according to claim 1, wherein
the charge/discharge controller is further configured to perform either or both of control decreasing a charge speed and control decreasing a discharge speed of a storage battery for which the predetermined index value has changed and approached the predetermined value, as control related to charge/discharge speed in charging and discharging of the storage battery.

5. The power storage control system according to claim 1, wherein
the predetermined index value at least includes a value indicating a change amount of a current storage capacity from an initial storage capacity of the storage battery.

6. The power storage control system according to claim 1, wherein
the predetermined index value at least includes any of an integrated value of charged electrical power amount to the storage battery, integrated value of discharged electrical power amount of the storage battery, integrated value of an increase in charge amount of the storage battery and integrated value of decrease in charge amount of the storage battery, or a value calculated based on a combination thereof.

7. The power storage control system according to claim 1, wherein
the predetermined index value at least includes a cumulative time for which the storage battery was a high-temperature state.

8. The power storage control system according to claim 1, wherein
the monitor is further configured to monitor a cumulative time for which a power conditioner connected to the storage battery was a high-temperature state in order to perform control relative to at least either of a charge amount or charge/discharge speed in charging and discharging of the storage battery, and estimate the replacement time of an electrolytic capacitor included by the power conditioner, based on the value of cumulative time for which the power conditioner was the high-temperature state.

9. The power storage control system according to claim 1, wherein
the monitor is further configured to monitor the predetermined index value at a predetermined cycle, and
wherein the charge/discharge controller, every time monitoring is performed at the predetermined cycle, performs control related to at least either of charge amount or charge/discharge speed in charging and discharging of the storage battery, based on the monitoring results.

10. The power storage control system according to claim 1, wherein
the charge/discharge controller is further configured to perform machine learning for control related to at least either of charge amount or charge/discharge speed in charging and discharging of the storage battery, based on past records of change of the predetermined index value of each of the storage batteries accompanying executing control related to at least either of charge amount or charge/discharge speed in charging and discharging of the storage battery, and to continue control related to at least either of charge amount or charge/discharge speed in charging and discharging of the storage battery, based on results of the machine learning.

11. The power storage control system according to claim 1, further comprising:
a first device including the monitor; and
a second device installed at a location different from the first device and including the charge/discharge controller,
wherein
the monitor included in the first device is further configured to generate a control setting related to control of the charge/discharge controller based on the monitoring results, and send the control setting thus generated to the charge/discharge controller included by the second device, and
the charge/discharge controller included in the second device is further configured to continue to control related to at least either of charge amount or charge/discharge speed in charging and discharging of the storage battery, based on the control setting sent by the monitor included by the first device.

12. The power storage control system according to claim 1, wherein
the plurality of power storage systems are power storage systems of consumers which charge storage batteries included in the power storage system with electrical power generated using renewable energy.

13. The power storage control system according to claim 2, wherein
the storage battery is a storage battery for which the predetermined index value has changed and approached the predetermined value, and the control is related to charge amount in charging and discharging of the storage battery.

14. The power storage control system according to claim 2, wherein
the charge/discharge controller is further configured to perform either or both of control decreasing a charge speed and control decreasing a discharge speed of a storage battery for which the predetermined index value has changed and approached the predetermined value, as control related to charge/discharge speed in charging and discharging of the storage battery.

15. The power storage control system according to claim 2, wherein
the predetermined index value at least includes a value indicating a change amount of a current storage capacity from an initial storage capacity of the storage battery.

16. The power storage control system according to claim 2, wherein
the predetermined index value at least includes any of an integrated value of charged electrical power amount to the storage battery, integrated value of discharged electrical power amount of the storage battery, integrated value of an increase in charge amount of the storage battery and integrated value of decrease in charge amount of the storage battery, or a value calculated based on a combination thereof.

17. The power storage control system according to claim 2, wherein
the predetermined index value at least includes a cumulative time for which the storage battery was a high-temperature state.

18. The power storage control system according to claim 2, wherein
the monitor is further configured to monitor a cumulative time for which a power conditioner connected to the storage battery was a high-temperature state in order to perform control relative to at least either of a charge amount or charge/discharge speed in charging and discharging of the storage battery, and estimate the replacement time of an electrolytic capacitor included by the power conditioner, based on the value of cumulative time for which the power conditioner was the high-temperature state.

19. A power storage control method executed by a power storage control system, the method comprising:
monitoring a predetermined index value having a correlation with a deterioration extent of a storage battery, for each storage battery included in a plurality of power storage systems; and
controlling a period in which the predetermined index value changes to a predetermined value for each of the storage batteries due to deterioration accompanying charging and discharging of the storage battery, by performing control related to at least either of decreasing an upper limit for charge amount of the storage battery, or raising a lower limit for the charge amount of the storage battery, based on monitoring results of the monitoring.

20. The power storage control system according to claim 1, wherein
storage batteries differing in having at least any of performance of the storage battery, manufacturer of the storage battery and deterioration state of the storage battery different, coexist among the storage batteries included in the plurality of power storage systems.

* * * * *